United States Patent
Kon

(10) Patent No.: US 10,281,661 B2
(45) Date of Patent: May 7, 2019

(54) OPTICAL RECEPTACLE, AND OPTICAL MODULE

(71) Applicant: Enplas Corporation, Saitama (JP)

(72) Inventor: Ayano Kon, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 16/067,828

(22) PCT Filed: Dec. 16, 2016

(86) PCT No.: PCT/JP2016/087469
§ 371 (c)(1),
(2) Date: Jul. 3, 2018

(87) PCT Pub. No.: WO2017/119258
PCT Pub. Date: Jul. 13, 2017

(65) Prior Publication Data
US 2019/0004263 A1    Jan. 3, 2019

(30) Foreign Application Priority Data
Jan. 4, 2016    (JP) ................. 2016-000127

(51) Int. Cl.
*G02B 6/32*    (2006.01)
*G02B 6/42*    (2006.01)

(52) U.S. Cl.
CPC ......... *G02B 6/4206* (2013.01); *G02B 6/4214* (2013.01)

(58) Field of Classification Search
CPC ...... G02B 6/32; G02B 6/4214; G02B 6/4204; G02B 6/4292; G02B 6/4249
See application file for complete search history.

(56) References Cited

U.S. PATENT DOCUMENTS 7,293,921 B2 * 11/2007 Okada ................. G02B 6/4246
385/89
2009/0244904 A1    10/2009 Morioka
(Continued)

FOREIGN PATENT DOCUMENTS

| JP | 2009-229996 A | 10/2009 |
| JP | 2013-156440 A | 8/2013 |
| JP | 2013-164497 A | 8/2013 |

OTHER PUBLICATIONS

International Search Report from International Application No. PCT/JP2016/087469 dated Mar. 14, 2017.

*Primary Examiner* — Jennifer Doan
(74) *Attorney, Agent, or Firm* — Brundidge & Stanger, P.C.

(57) ABSTRACT

This optical receptacle is provided with: an optical receptacle main body provided with a plurality of first optical surfaces and a plurality of second optical surfaces; and an optical filter. Light emitted from a photoelectric conversion element becomes incident on the first optical surfaces. The second optical surfaces allow light which becomes incident on the first optical surfaces, and passes through the inside, to exit towards an end surface of an optical transmission body. The optical filter is disposed so as to face some of the plurality of second optical surfaces, and attenuates the amount of light from the facing second optical surfaces. The optical filter is disposed with respect to at least one of the one or more second optical surfaces facing the optical filter, such that positional deviation between the first optical surfaces and the second optical surfaces is taken into consideration.

7 Claims, 5 Drawing Sheets

(56) References Cited

U.S. PATENT DOCUMENTS

2011/0170832 A1* 7/2011 Yamai ................ G02B 6/4201
385/92
2015/0020964 A1   1/2015 Tanazawa et al.
2015/0036985 A1   2/2015 Shibuya et al.

* cited by examiner

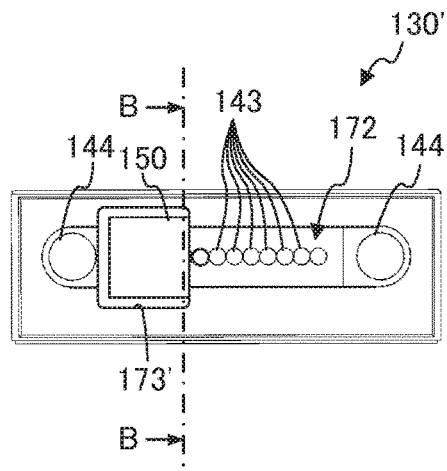
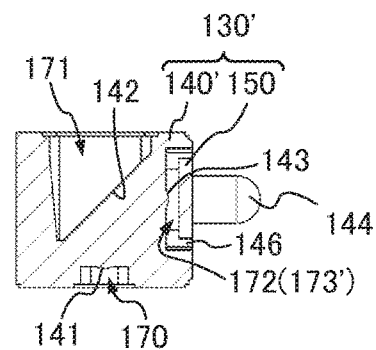
FIG. 5A                    FIG. 5B
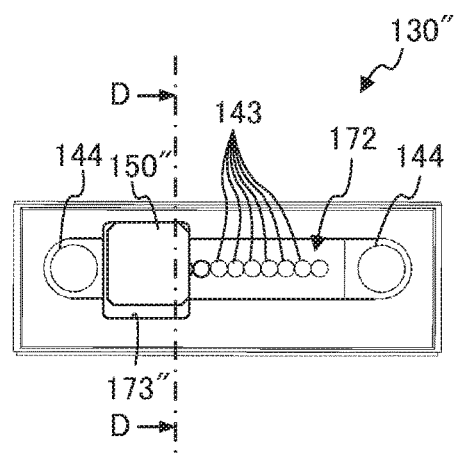
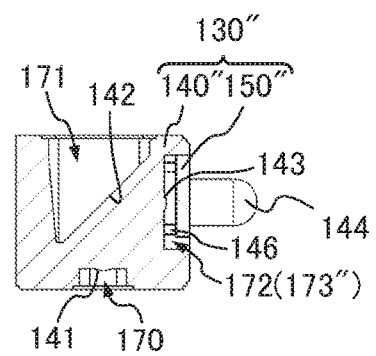
FIG. 5C                    FIG. 5D

OPTICAL RECEPTACLE, AND OPTICAL MODULE

TECHNICAL FIELD

The present invention relates to an optical receptacle, and an optical module including the same.

BACKGROUND ART

Conventionally, in optical communications using an optical transmission member such as an optical fiber or an optical waveguide, an optical module including a light emitting element such as a surface-emitting laser (for example, a vertical cavity surface emitting laser (VCSEL)) has been used. The optical module includes one or more photoelectric conversion elements (light emitting elements or light receiving elements), and a light coupling element for transmission and reception (hereinafter also referred to as an "optical receptacle").

In an optical module for optical communications, the quantity of light emitted from an optical receptacle for transmission is required to be attenuated for ensuring safety, and thus an optical filter for attenuating the quantity of the light emitted from the optical receptacle for transmission may be used (see, for example, PTL 1).

FIG. 1 is a cross-sectional view of optical receptacle 1 described in PTL 1. Optical receptacle 1 described in PTL 1 includes optical receptacle body 2 and optical filter 3 (for example, light-attenuating filter). As illustrated in FIG. 1, optical receptacle body 2 includes lens surfaces 4 arranged in a line at equal intervals on the bottom surface of optical receptacle body 2, and optical surface 5 disposed opposite lens surfaces 4. Optical filter 3 is disposed on a part of optical surface 5. Optical receptacle 1 described in PTL 1 is used with photoelectric conversion device which has a plurality of light emitting elements and light receiving elements and which is disposed on the lens surface 4 side, and with a plurality of optical transmission members which are disposed on the optical surface 5 side. In optical receptacle 1 described in PTL 1, optical filter 3 is disposed on the optical path of light emitted from the light emitting elements and incident on the optical transmission members, thereby attenuating the quantity of the light emitted from optical receptacle 1 on the transmission side.

CITATION LIST

Patent Literature

PTL 1
Japanese Patent Application Laid-Open No. 2013-156440

SUMMARY OF INVENTION

Technical Problem

Optical filter 3 used in optical receptacle 1 typically has a sufficient size so that all the light can be incident on optical filter 3. However, in an optical module for transmission and reception, when too large optical filter 3 is disposed on a part functioning as a transmission side, optical filter 3 may be unnecessarily disposed also on a part functioning as a reception side. Accordingly, optical receptacle 1 described in PTL 1 may need some improvement, such as reducing the size of to-be-used optical filter 3 for disposing the same in a necessary and satisfactory range.

The first object of the present invention is to provide an optical receptacle including an optical filter which has an appropriate size and is disposed in a necessary and satisfactory region. The second object of the present invention is to provide an optical module including the optical receptacle.

Solution to Problem

An optical receptacle according to the present invention is to be disposed between a plurality of photoelectric conversion elements and optical transmission members, and configured to optically couple each of the photoelectric conversion elements to each of end surfaces of the optical transmission members. The optical receptacle includes an optical receptacle body including a plurality of first optical surfaces each configured to allow light emitted from the photoelectric conversion element to be incident on the first optical surface, or to emit, toward the photoelectric conversion element, light emitted from the end surface of the optical transmission member and traveling inside the optical receptacle body, and a plurality of second optical surfaces each configured to emit, toward the end surface of the optical transmission member, light incident on the first optical surface and traveling inside the optical receptacle body, or to allow light emitted from the end surface of the optical transmission member to be incident on the second optical surface; and an optical filter which is disposed so as to face one or more, namely part of the second optical surfaces, and which is configured to attenuate quantity of the light from the facing one or more second optical surfaces. The optical filter is disposed so that the following formula (1) is satisfied for at least one of the one or more second optical surfaces facing the optical filter.

$$x \geq \frac{\Delta a \times d}{t} + \frac{D}{2} \qquad \text{Formula (1)}$$

In the formula (1), x is a distance from the central axis of the second optical surface facing the optical filter to an outer edge of the optical filter, which is closest to the central axis, $\Delta a$ is a distance from the center of the first optical surface to the optical axis of a light beam which is incident on the center of the second optical surface so as to travel along the central axis of the second optical surface; d is a distance from the optical filter to the center of the second optical surface, t is a length of the optical axis from the center of the second optical surface to a point on the optical axis, which is closest to the center of the first optical surface; and D is a lens effective diameter of the second optical surface.

An optical module according to the present invention includes a substrate, a plurality of photoelectric conversion elements disposed on the substrate, and the optical receptacle according to the present invention, which has the first optical surfaces disposed on the substrate so as to respectively face the photoelectric conversion elements.

Advantageous Effects of Invention

According to the present invention, an optical filter to be used can become smaller, and thus the costs for the materials of an optical receptacle and optical module can be reduced. In the optical module for transmission and reception according to the present invention, the optical filter can be disposed in a necessary and satisfactory range, and thus the quantity of reception light is not attenuated.

BRIEF DESCRIPTION OF DRAWINGS

FIGS. 5A to 5D illustrate configurations of optical receptacles according to modifications 1 and 2.

DESCRIPTION OF EMBODIMENTS

Hereinafter, an embodiment of the present invention will be described in detail with reference to the accompanying drawings.

(Configuration of Optical Module)

Figure 1:
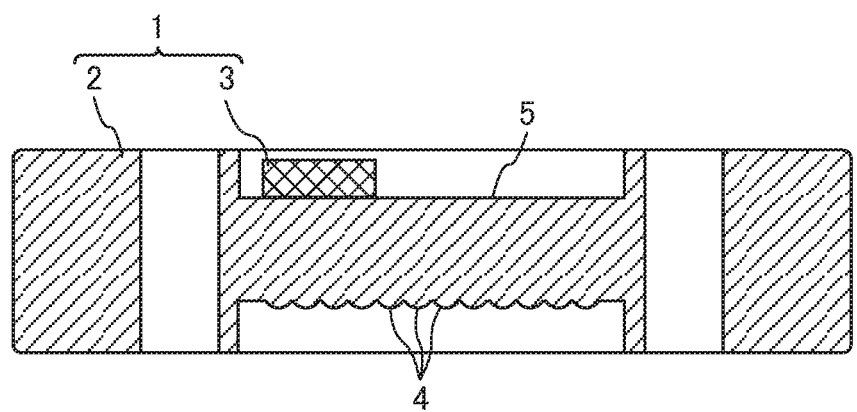
FIG. 1 is cross-sectional view of an optical receptacle in PTL 1.
Figure 2:
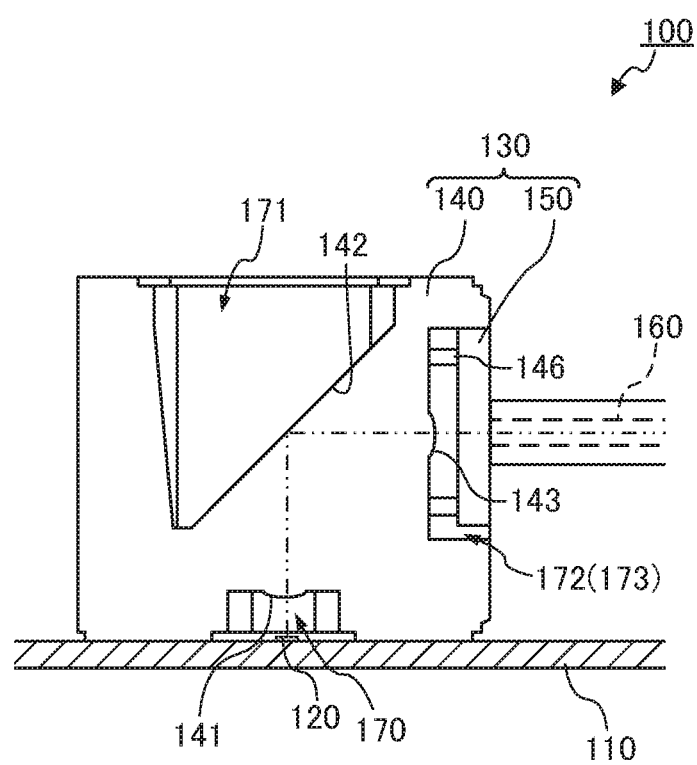
FIG. 2 is a schematic cross-sectional view of an optical module according to an embodiment of the present invention.

FIG. 2 is a cross-sectional view of optical module 100 according to an embodiment of the present invention. In FIG. 2, the hatching in the cross section of optical receptacle 130 is omitted for illustrating an optical path in optical receptacle 130. The dashed line indicates the optical axis of light in FIG. 2. FIG. 2 illustrates a cross section of optical receptacle 130 taken along line A-A of below-described FIG. 3C.

As illustrated FIG. 2, optical module 100 includes substrate 110, a plurality of photoelectric conversion elements 120 and optical receptacle 130. Optical module 100 is used in a state where optical transmission members 160 are connected to optical receptacle 130.

Photoelectric conversion elements 120 and optical receptacle 130 are disposed on substrate 110. Substrate 110 also includes a protrusion (not illustrated) formed thereon, which corresponds to positioning recess 145 (refer to below-described FIG. 3B) of below-described optical receptacle body 140. Fitting the protrusion into positioning recess 145 enables fixing of optical receptacle 130 at a predetermined position relative to photoelectric conversion elements 120 disposed on substrate 110. Substrate 110 may be formed from any material, and is for example, a glass composite substrate and a glass epoxy substrate.

Photoelectric conversion element 120 is a light emitting element or a light receiving element, and disposed on substrate 110. In the present embodiment, four light emitting elements and four light receiving elements are disposed on substrate 110. In the present embodiment, four light emitting elements (front side) and four light receiving elements (back side) are arranged in one straight line along the direction perpendicular to the drawing in FIG. 2. The light emitting elements are used as photoelectric conversion elements 120 in a part functioning as optical module 100 for transmission. The light receiving elements are used as photoelectric conversion elements 120 in a part functioning as optical module 100 for reception. The light emitting element is, for example, a vertical cavity surface emitting laser (VCSEL). The light receiving element is, for example, a photodiode (PD).

Optical receptacle 130 is disposed on substrate 110 so that below-described first optical surfaces 141 face photoelectric conversion elements 120, respectively. Optical receptacle 130 optically couples photoelectric conversion elements 120 and the end surfaces of optical transmission members 160 when disposed between photoelectric conversion elements 120 and optical transmission members 160. In the part functioning as optical module 100 for transmission, optical receptacle 130 emits light emitted from photoelectric conversion element 120 (light emitting element) toward the end surface of optical transmission member 160. In the part functioning as optical module 100 for reception, optical receptacle 130 emits light emitted from the end surface of optical transmission member 160 toward photoelectric conversion element 120 (light receiving element). Optical module 100 according to the present embodiment is an optical module for transmission and reception. The configuration of optical receptacle 130 will be described in detail below.

The types of optical transmission members 160 are not limited. Examples of optical transmission members 160 include optical fibers and optical waveguides. Although not illustrated, optical transmission member 160 is connected to optical receptacle 130 via a ferrule. The ferrule includes a recess (not illustrated) formed thereon, which corresponds to positioning protrusion 144 of below-described optical receptacle 130. Fitting of positioning protrusion 144 into the recess enables fixing of the end surface of optical transmission member 160 at a predetermined position relative to optical receptacle 130. In the present embodiment, optical transmission member 160 is an optical fiber. The optical fiber may be a single-mode optical fiber or a multi-mode optical fiber.

(Configuration of Optical Receptacle)

Figure 3C:
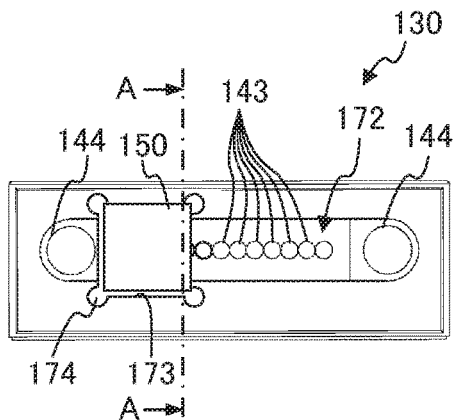
FIGS. 3A to 3E illustrate a configuration of an optical receptacle according to the embodiment of the present invention.
Figure 3A:
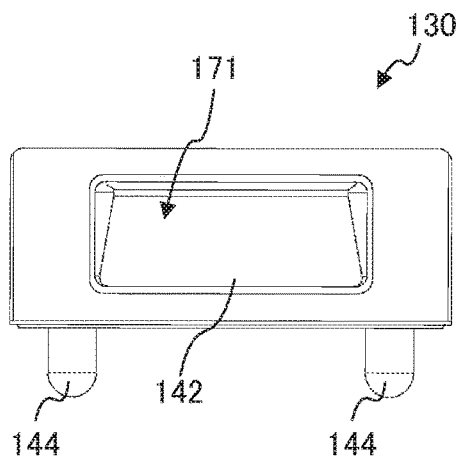
Figure 3D:
Figure 3B:
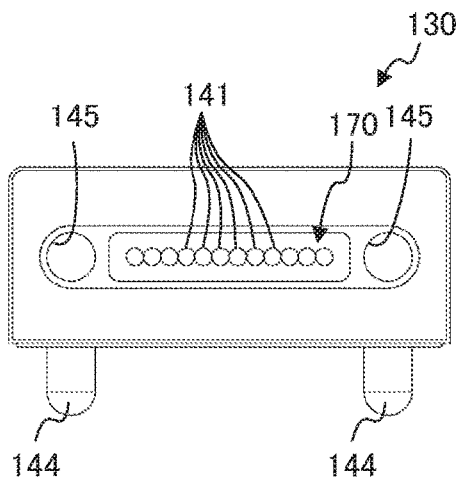
Figure 3E:
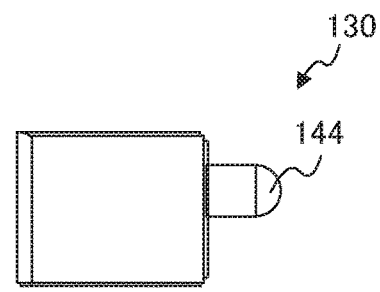

FIGS. 3A to 3E illustrate a configuration of optical receptacle 130 according to the present embodiment. Of optical receptacle 130, FIG. 3A is a plan view, FIG. 3B is a bottom view, FIG. 3C is a front view, FIG. 3D is a back view, and FIG. 3E is a left side view.

As illustrated in FIGS. 2 and 3C, optical receptacle 130 includes optical receptacle body 140 and optical filter 150. In the present embodiment, optical filter 150 has a substantially rectangular shape in plan view.

Optical receptacle body 140 is a member having a substantially cuboidal shape. In the present embodiment, optical receptacle body 140 includes first recess 170 formed on the bottom surface thereof, second recess 171 formed on the top surface thereof, and third recess 172 formed on the front surface thereof. In the present embodiment, optical receptacle body 140 (third recess 172) also includes fourth recess 173 having a substantially rectangular shape in plan view.

Fourth recess 173 houses optical filter 150 placed in a predetermined position. Fourth recess 173 may have any shape or size as long as it can house optical filter 150 placed in a predetermined position. In optical receptacle 130 according to the present embodiment, fourth recess 173 has a substantially rectangular shape in plan view. Fourth recess 173 further includes relief portion 174 for housing a corner of optical filter 150. Relief portion(s) 174 is disposed on at least one corner of fourth recess 173. Optical filter 150 is disposed in fourth recess 173 so that at least one corner of optical filter 150 is housed in relief portion(s) 174. The number of relief portions 174 can be appropriately set in accordance with the size of optical filter 150 and fourth recess 173. As illustrated in FIG. 3C, in the present embodiment, relief portions 174 are formed at respective four corners of fourth recess 173, and each of four corners of optical filter 150 is housed in each of the corners of fourth recess 173 (i.e., in relief portion 174). In optical receptacle 130 in plan view, optical filter 150 is disposed in fourth recess 173 so that at least one side of optical filter 150 is in contact with a straight line (or straight lines each) between two adjacent corners of fourth recess 173. The disposition enables positioning of optical filter 150 at a predetermined position. In the present embodiment, optical filter 150 is disposed in fourth recess 173 so that two adjacent sides of optical filter 150 are respectively in contact with two adjacent straight lines each between two adjacent corners of fourth recess 173, in optical receptacle 130 in plan view.

Optical receptacle body 140 includes first optical surfaces 141, reflection surface 142, second optical surfaces 143, positioning protrusion 144, positioning recess 145 and supporter 146. In the present embodiment, the numbers of respective first optical surfaces 141 and second optical surfaces 143 are twelve each. Optical receptacle body 140 is formed of a material that transmits light having a wavelength used for optical communications. Examples of the materials for optical receptacle body 140 include transparent resins, such as polyetherimide (PEI) and cyclic olefin resins. Optical receptacle body 140 is produced by, for example, injection molding. Producing optical receptacle body 140 by injection molding may cause a relative positional displacement between first optical surface 141 and second optical surface 143. In the present embodiment, as described in detail below, optical filter 150 is disposed in fourth recess 173 of optical receptacle body 140 in view of the positional displacement of first optical surface 141 relative to second optical surface 143.

First optical surface 141 is an optical surface for allowing light emitted from photoelectric conversion element 120 (light emitting element) to enter optical receptacle body 140, or for emitting, toward photoelectric conversion element 120 (light receiving element), light which is emitted from the end surface of optical transmission member 160 and travels inside optical receptacle body 140. The number of first optical surfaces 141 may be any number that is more than one. In the present embodiment, the number of first optical surfaces 141 is twelve, as described above. In optical receptacle 130 according to the present embodiment, four first optical surfaces 141 from the right in FIG. 3B are used as first optical surfaces 141 on the transmission side, and four first optical surfaces 141 from the left are used as first optical surfaces 141 on the reception side. In the present embodiment, four central first optical surfaces 141 are unused. First optical surfaces 141 are disposed on the bottom surface of optical receptacle body 140 so as to face photoelectric conversion elements 120, respectively. In the present embodiment, on the bottom surface of first recess 170 formed in the rear side (bottom surface) of optical receptacle body 140, twelve first optical surfaces 141 are disposed in a line along the long side direction. First optical surface 141 may have any shape. In the present embodiment, first optical surface 141 is a convex lens surface protruding toward photoelectric conversion element 120. First optical surface 141 has a circular shape in plan view. The central axis of first optical surface 141 is preferably perpendicular to the light emitting surface or to the light receiving surface of photoelectric conversion element 120 (and the surface of substrate 110). The central axis of first optical surface 141 also preferably coincides with the optical axis of light emitted from photoelectric conversion element 120 (light emitting element) or light incident on photoelectric conversion element 120 (light receiving element).

Reflection surface 142 is an optical surface for reflecting light incident on first optical surface 141 toward second optical surface 143, or light incident on second optical surface 143 toward first optical surface 141. Reflection surface 142 forms a part of the inner surface of second recess 171. Reflection surface 142 is inclined so that the distance from optical transmission member 160 (on the front side) decreases from the bottom surface to the top surface of optical receptacle body 140. Reflection surface 142 may have any inclination angle. In the present embodiment, reflection surface 142 has an inclination angle of 45° relative to the optical axis of light incident on reflection surface 142. Reflection surface 142 may have any shape. In the present embodiment, reflection surface 142 has a planar shape. Light incident on first optical surface 141 or second optical surface 143 is incident on reflection surface 142 at an incident angle larger than the critical angle.

Second optical surface 143 is an optical surface for emitting, toward the end surface of optical transmission member 160 (and optical filter 150), light which is incident on first optical surface 141 and travels inside optical receptacle body 140, or allowing light emitted from the end surface of optical transmission member 160 to enter optical receptacle body 140. The number of second optical surfaces 143 may be any number that is more than one. In the present embodiment, the number of second optical surfaces 143 is twelve, as described above. In optical receptacle 130 according to the present embodiment, four second optical surfaces 143 from the right in FIG. 3C are used as second optical surfaces 143 on the reception side, and four second optical surfaces 143 from the left are used as second optical surfaces 143 on the transmission side. In the present embodiment, four central second optical surfaces 143 are unused. Part of second optical surfaces 143 (second optical surfaces 143 on the transmission side and part of unused second optical surfaces 143) are disposed on the front surface of optical receptacle body 140 so as to face optical filter 150. The other part of second optical surfaces 143 (second optical surfaces 143 on the reception side and the other part of unused second optical surfaces 143) are disposed on the front surface of optical receptacle body 140 so as to face the end surfaces of optical transmission members 160. In the present embodiment, on the bottom surface of third recess 172 formed in the front surface of optical receptacle body 140, twelve second optical surfaces 143 are disposed in a line along the long side direction. Second optical surface 143 may have any shape. In the present embodiment, second optical surface 143 is a convex lens surface protruding toward optical filter 150 or the end surface of optical transmission member 160. The central axis of second optical surface 143 is preferably perpendicular to the surface of optical filter 150 or to the end surface of optical transmission member 160. The central axis of second optical surface 143 also preferably coincides with the optical axis of light emitted from the end surface of optical transmission member 160 or of light incident on the end surface of optical transmission member 160 (and optical filter 150).

Fitting of positioning protrusion 144 into a recess formed in the ferrule holding optical transmission members 160 enables positioning of the end surfaces of optical transmission members 160 at predetermined positions relative to second optical surfaces 143, respectively. Positioning protrusion 144 may have any shape or size which can be appropriately set in accordance with, for example, the shape of the ferrule. In the present embodiment, positioning protrusion 144 has a substantially cylindrical shape.

Fitting a protrusion formed in substrate 110 into positioning recess 145 enables positioning of first optical surfaces 141 of optical body 140 at predetermined positions relative to photoelectric conversion elements 120, respectively. Positioning recess 145 may have any shape or size which can be appropriately set in accordance with, for example, the shape of substrate 110. In the present embodiment, positioning recess 145 has a substantially cylindrical shape.

Supporter 146 supports below-described optical filter 150 to fix optical filter 150 at a predetermined height relative to second optical surfaces 143. Supporter 146 is disposed on the bottom surface of third recess 172 (fourth recess 173). Supporter 146 may have any shape or size as long as it can fix optical filter 150 at a predetermined height and does not intercept light passing through optical receptacle 130.

Optical filter 150 reduces the quantity of light emitted from second optical surface 143. Specifically, optical filter 150 allows the light emitted from second optical surface 143 to enter optical filter 150, thereby attenuating the quantity of the entering light, and emits the light outside. Optical filter 150 is disposed so as to face part (namely, one or more) of second optical surfaces 143. In the present embodiment, as described above, optical filter 150 is disposed in fourth recess 173 so that one corner of optical filter 150 is housed in one relief portion 174. As described in detail below, optical filter 150 is disposed so that the formula (1) below is satisfied for at least one of the one or more second optical surfaces 143 facing optical filter 150. Specifically, optical filter 150 is disposed so that the formula (1) below is satisfied for at least one of the one or more second optical surfaces 143 which face optical filter 150 and function as transmission filters. It is preferred, for example, that optical filter 150 is disposed so that the formula (1) below is satisfied for second optical surface 143 which is one of the one or more second optical surfaces 143 facing optical filter 150 and which is closest to second optical surfaces 143 not facing optical filter 150. In the present embodiment, optical filter 150 is disposed so that the formula (1) below is satisfied for at least one second optical surface 143 functioning as a transmission filter (second optical surface 143 fourth from the left in FIG. 3C), among five second optical surfaces 143 facing optical filter 150.

$$x \geq \frac{\Delta a \times d}{t} + \frac{D}{2} \qquad \text{Formula (1)}$$

In the formula (1), x is a distance from central axis CA of second optical surface 143 facing optical filter 150 to an outer edge of optical filter 150, which is closest to central axis CA, $\Delta a$ is a distance from the center of first optical surface 141 to optical axis OA of a light beam which is incident on the center of second optical surface 143 so as to travel along central axis CA of second optical surface 143 and which is reflected by reflection surface 142; d is a distance from optical filter 150 to the center of second optical surface 143, t is a length of optical axis OA from the center of second optical surface 143 to a point on optical axis OA, which is closest to the center of first optical surface 141; and D is a lens effective diameter of second optical surface 143.

Optical filter 150 is designed to have a shape and size so that the quantity of light emitted from second optical surface 143 is reduced, but the quantity of light emitted from end surface 161 of optical transmission member 160 is not reduced. Optical filter 150 is designed appropriately in accordance with, for example, the size, number and disposition of second optical surfaces 143. Optical filter 150 has, for example, a substantially rectangular shape in plan view. The types of optical filters 150 are not limited. Examples of optical filters 150 include glass filters. A commercially available glass filter, such as BK7 (with a refractive index of 1.51633) manufactured by Fujitok Corporation may be used.

(Optical Path in Optical Module)

Hereinafter, optical paths in optical module 100 according to the present embodiment will be described.

In the part functioning as optical module 100 for transmission, light emitted from photoelectric conversion element 120 (light emitting element) enters optical receptacle body 140 from first optical surface 141. The entering light is converted into collimate light at first optical surface 141, and propagates toward reflection surface 142. The entering light is then reflected by reflection surface 142, and propagates toward second optical surface 143. The light reaching second optical surface 143 is then emitted outside optical receptacle body 140 from second optical surface 143, and passes through optical filter 150 to reach the end surface of optical transmission member 160. The emitted light is condensed at second optical surface 141 and reaches the center of the end surface of optical transmission member 160 while the quantity of the light is attenuated by optical filter 150.

In the part functioning as optical module 100 for reception, meanwhile, light emitted from the end surface of optical transmission member 160 enters optical receptacle body 140 from second optical surface 143 without passing through optical filter 150. The light entering optical receptacle body 140 is converted into collimate light at second optical surface 143, and propagates toward reflection surface 142. The entering light is then reflected by reflection surface 142, and propagates toward first optical surface 141. The light reaching first optical surface 141 is then emitted outside optical receptacle body 140 from first optical surface 141, and reaches photoelectric conversion element 120 (light receiving element). The emitted light is condensed at first optical surface 141 and reaches the center of the light receiving surface of optical transmission member 120 (light receiving element).

As can be understood from the above, optical receptacle 130 according to the present embodiment can optically and appropriately couple photoelectric conversion elements 120 and the end surfaces of optical transmission members 160.

(Disposition of Optical Filter)

Figure 4:
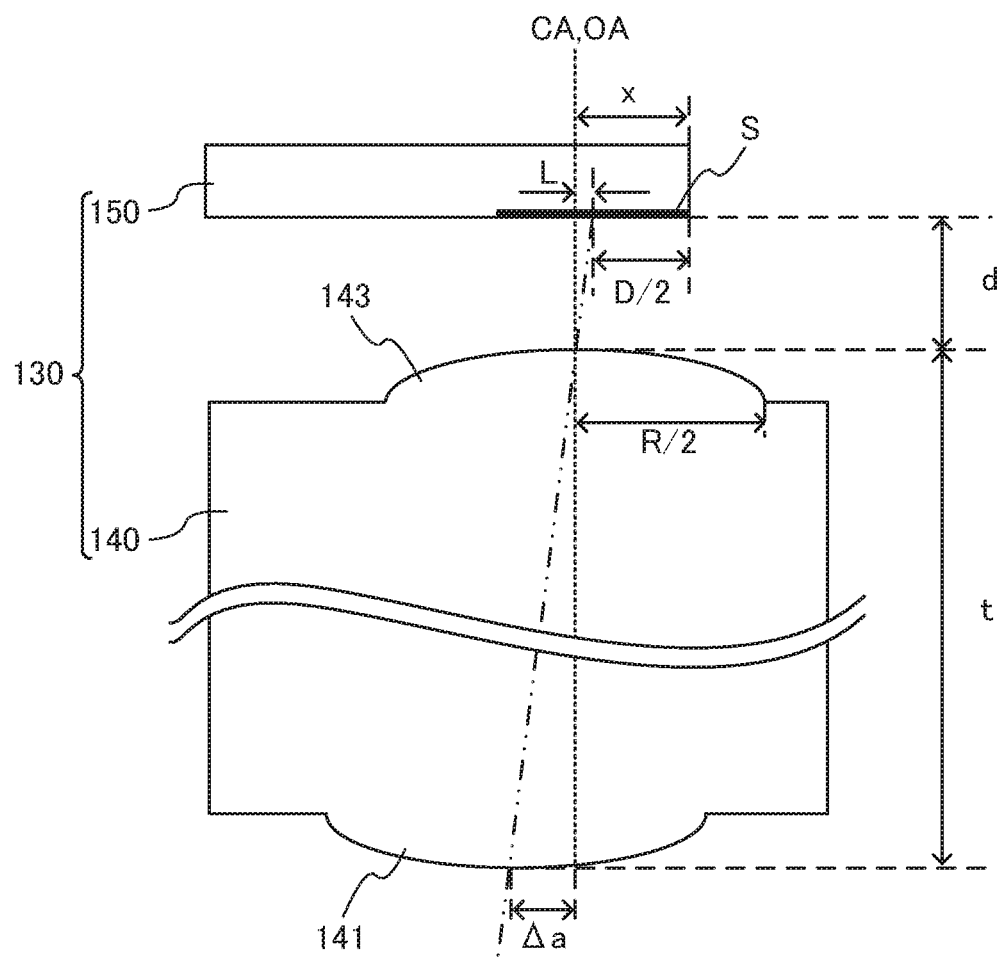
FIG. 4 is an enlarged schematic cross-sectional view of a part of the optical receptacle for describing the disposition of an optical filter relative to an optical receptacle body.

Hereinafter, the disposition of optical filter 150 relative to optical receptacle body 140 will be the described. FIG. 4 is an enlarged schematic cross-sectional view of a part of optical receptacle 130 for describing the disposition of optical filter 150 relative to optical receptacle body 140. In FIG. 4, a portion filled with black on optical filter 150 indicates spot S irradiated with light incident on optical filter 150.

As described above, in optical receptacle 130 according to the present embodiment, optical filter 150 is disposed so that the formula (1) below is satisfied for at least one of the one or more second optical surfaces 143 which face optical filter 150. In the formula (1) below, the first term in the right side represents length L of a displacement between central axis CA of second optical surface 143 and the center of spot S irradiated with light incident on optical filter 150, which is caused by the positional displacement of first optical surface 141 relative to second optical surface 143. The second term in the right side represents the radius of spot S irradiated with light incident on optical filter 150, namely radius D/2 of a lens effective diameter.

$$x \geq \frac{\Delta a \times d}{t} + \frac{D}{2} \qquad \text{Formula (1)}$$

In the formula (1), x is a distance from central axis CA of second optical surface 143 facing optical filter 150 to an outer edge of optical filter 150, which is closest to central axis CA, Δa is a distance from the center of first optical surface 141 to optical axis OA of a light beam which is incident on the center of second optical surface 143 so as to travel along central axis CA of second optical surface 143, and which is reflected by reflection surface 142; d is a distance from optical filter 150 to the center of second optical surface 143, t is a length of optical axis OA from the center of second optical surface 143 to a point on optical axis OA, which is closest to the center of first optical surface 141; and D is a lens effective diameter of second optical surface 143.

Firstly, a case is described where no positional displacement is generated (i.e., Δa=0) between first optical surface 141 and second optical surface 143. The first term in the right side becomes zero in the above formula (1) in this case. That is, light emitted from second optical surface 143 toward optical filter 150 reaches, while being diffused, the surface of optical filter 150 facing second optical surface 143 within an area defined by positions apart from central axis CA of second optical surface 143 by half the length (D/2) of lens effective diameter D of second optical surface 143. Light incident on optical filter 150 from an air layer has a refraction angle smaller than its incident angle. Therefore, it is sufficient for optical filter 150 to be disposed throughout the area defined by the positions apart from central axis CA of second optical surface 143 by half the length (D/2) of lens effective diameter D of second optical surface 143.

Secondly, a case is described where first optical surface 141 and second optical surface 143 has a positional displacement (i.e., Δa>0). As illustrated in FIG. 4, when there is a positional displacement between first optical surface 141 and second optical surface 143, the central position of irradiated spot S is displaced from central axis CA of second optical surface 143. In such a case, a part of light cannot enter optical filter 150, when disposing optical filter 150, with no consideration for the positional displacement between first optical surface 141 and second optical surface 143, within the area defined by the positions apart from central axis CA of second optical surface 143 by half the length (D/2) of lens effective diameter D of second optical surface 143, as with the case of no positional displacement being generated (i.e., Δa=0). Typically, optical filter 150 having a sufficient size is used for ensuring the passing of light emitted from second optical surface 143 through optical filter 150 even with such a positional displacement between first optical surface 141 and second optical surface 143. This increases the cost, as optical filter 150 is disposed on a part which does not contribute to the attenuation of the light quantity. Further, when a too large optical filter is disposed on a part functioning as a transmission side in an optical module for transmission and reception, the optical filter may be disposed also on a part functioning as a reception side, thereby attenuating the quantity of reception light.

In optical receptacle 130 according to the present embodiment, optical filter 150 is disposed so that the above formula (1) is satisfied for at least one of the one or more second optical surfaces 143 which face optical filter 150, in view of the positional displacement between first optical surface 141 and second optical surface 143. A region where optical filter 150 is to be disposed on for attenuating the quantity of light emitted from second optical surface 143 can be determined on the basis of the parameters (Δa, d, t and D) which can be previously known from the information, such as the positional accuracy, settings and measurements of first optical surface 141 and second optical surface 143. Optical filter 150 having an appropriate size thus can be disposed in a necessary and satisfactory region in optical receptacle 130 according to the present embodiment.

It is preferred that optical filter 150 is disposed so that the following formula (2) is further satisfied in view of reducing a part which is not used for attenuating the light quantity.

$$\frac{R}{2} \geq x \qquad \text{Formula (2)}$$

In the formula (2), x is a distance from central axis CA of second optical surface 143 facing optical filter 150 to an outer edge of optical filter 150, which is closest to central axis CA, and R is the diameter of second optical surface 143.

(Effects)

From the foregoing, in optical receptacle 130 according to the present embodiment, optical filter 150 is disposed relative to optical receptacle body 140 in view of the positional displacement between first optical surface 141 and second optical surface 143. The part which is not used for attenuating the light quantity can be reduced in optical filter 150, thereby reducing the material costs for optical receptacle 130 and optical module 100 according to the present embodiment. Further, optical filter 150 can be disposed only in a necessary and satisfactory range, thereby preventing attenuation of the quantity of reception light by optical filter 150 in an optical module for transmission and reception.

In optical receptacle 130 according to the above embodiment, a configuration is described, in which a corner of optical filter 150 is housed in relief portion 174 of fourth recess 173 in optical receptacle body 140. The configuration of the optical receptacle according to the present invention is not limited to the above, as long as an optical filter can be disposed in the fourth recess while being placed in a predetermined position.

FIGS. 5A to 5D illustrate optical receptacle 130' according to modification 1, and optical receptacle 130" according to modification 2. FIG. 5A is a front view of optical receptacle 130' according to modification 1, and FIG. 5B is a cross-sectional view of the same taken along line B-B of FIG. 5A. FIG. 5C is a front view of optical receptacle 130" according to modification 2, and FIG. 5D is a cross-sectional view of the same taken along line D-D of FIG. 5C.

As illustrated in FIGS. 5A and 5B, fourth recess 173' in optical receptacle body 140' according to modification 1 has a substantially rectangular shape in plan view, with its corners subjected to R-chamfering. A straight line between two adjacent corners of fourth recess 173' is longer than a side of optical filter 150. Optical filter 150 is disposed in fourth recess 173' so that one side of optical filter 150 is in contact with a straight line between two adjacent corners of fourth recess 173'. This enables disposing of optical filter 150, while being placed in a predetermined position, in fourth recess 173' in optical receptacle 130' according to modification 1.

As illustrated in FIGS. 5C and 5D, fourth recess 173" in optical receptacle body 140" according to modification 2 has a substantially rectangular shape in plan view, with its corners subjected to R-chamfering. Optical filter 150" of optical receptacle 130" has a substantially rectangular shape in plan view, with at least one of its corners subjected to C-chamfering. Optical filter 150" is disposed in fourth recess 173" so that two adjacent sides of optical filter 150" are respectively in contact with two adjacent straight lines each between two adjacent corners of fourth recess 173". This enables disposing of optical filter 150", while being placed in a predetermined position, in fourth recess 173" in optical receptacle 130" according to modification 2. In optical receptacle 130" according to modification 2, at least one corner of optical filter 150" may be subjected to R-chamfering in place of C-chamfering.

In optical receptacle 130 according to the above embodiment, optical receptacle body 140 includes reflection surface 142; however, reflection surface 142 may be unnecessary in an optical receptacle body of the optical receptacle according to the present invention. In such a case, a first optical surface and a second optical surface are disposed opposite each other in the optical receptacle body. In the part functioning as an optical module for transmission, light emitted from a photoelectric conversion element (light emitting element) enters the optical receptacle body from the first optical surface. The entering light reaches the second optical surface without being reflected by reflection surface 142, and is emitted outside the optical receptacle body from the second optical surface. The emitted light passes through an optical filter to reach the end surface of an optical transmission member. In the part functioning as an optical module for reception, meanwhile, light emitted from the end surface of the optical transmission member enters the optical receptacle body from the second optical surface. The entering light reaches the first optical surface, and is emitted outside the optical receptacle body from the first optical surface. The emitted light reaches the photoelectric conversion element (light receiving element). When the optical receptacle body does not include any reflection surface, in the above formula (1), $\Delta a$ is a distance from the center of first optical surface to the optical axis of a light beam which is incident on the center of the second optical surface so as to travel along the central axis of the second optical surface.

This application claims priority based on Japanese Patent Application No. 2016-000127, filed on Jan. 4, 2016, the entire contents of which including the specification and the drawings are incorporated herein by reference.

INDUSTRIAL APPLICABILITY

The optical receptacles and optical modules according to the present invention are advantageous for optical communications using an optical transmission member.

REFERENCE SIGN LIST

1 Optical Receptacle
2 Optical Receptacle Body
3 Optical Filter
4 Lens Surface
5 Optical Surface
100 Optical Module
110 Substrate
120 Photoelectric Conversion Element
130, 130', 130" Optical Receptacle
140, 140', 140" Optical Receptacle Body
141 First Optical Surface
142 Reflection Surface
143 Second Optical Surface
144 Positioning Protrusion
145 Positioning Recess
146 Supporter
150, 150" Optical Filter
160 Optical Transmission Member
170 First Recess
171 Second Recess
172 Third Recess
173, 173', 173" Fourth Recess
174 Relief Portion
CA Central Axis
OA Optical Axis
S Irradiated Spot

The invention claimed is:

1. An optical receptacle to be disposed between a plurality of photoelectric conversion elements and optical transmission members, the optical receptacle being configured to optically couple the photoelectric conversion elements to respective end surfaces of the optical transmission members, the optical receptacle comprising:

an optical receptacle body including:
a plurality of first optical surfaces configured to allow incidence of light emitted from the photoelectric conversion elements, or to emit, toward the photoelectric conversion elements, light emitted from the end surfaces of the optical transmission members and traveling inside the optical receptacle body, and
a plurality of second optical surfaces configured to emit, toward the end surfaces of the optical transmission members, light incident on the first optical surfaces and traveling inside the optical receptacle body, or to allow incidence of light emitted from the end surfaces of the optical transmission members; and an optical filter disposed so as to face part of the second optical surfaces, the part of the second optical surfaces being one or more of the second optical surfaces, the optical filter being configured to attenuate quantity of the light emitted from the part of the second optical surfaces facing the optical filter, wherein the optical filter is disposed so that the following formula (1) is satisfied for at least one of the part of the second optical surfaces facing the optical filter:

$$x \geq \frac{\Delta a \times d}{t} + \frac{D}{2} \qquad \text{Formula (1)}$$

wherein:
x is a distance from a central axis of the second optical surface facing the optical filter to an outer edge of the optical filter, the outer edge being closest to the central axis,
$\Delta a$ is a distance from a center of a corresponding one of the first optical surfaces to an optical axis of a light beam which is incident on a center of the second optical surface so as to travel along the central axis of the second optical surface,
d is a distance from the optical filter to the center of the second optical surface,
t is a length of the optical axis from the center of the second optical surface to a point on the optical axis, the point being closest to the center of the first optical surface, and
D is a lens effective diameter of the second optical surface.

2. The optical receptacle according to claim 1, wherein the at least one of the part of the second optical surfaces is closest to the second optical surfaces not facing the optical filter.

3. The optical receptacle according to claim 1, wherein:
the optical receptacle body includes a recess having a substantially rectangular shape in plan view, and
the optical filter has a substantially rectangular shape in plan view, wherein:

the recess includes at least one relief portion for housing at least one corner of the optical filter, the at least one relief portion being disposed in at least one corner of the recess, and the optical filter is disposed so that the at least one corner of the optical filter is housed in the at least one relief portion.

4. The optical receptacle according to claim 1, wherein:
the optical receptacle body includes a recess having a substantially rectangular shape in plan view, the recess having corners subjected to R-chamfering, and
the optical filter has a substantially rectangular shape in plan view, wherein:
   a straight line between adjacent two of the corners of the recess is longer than a side of the optical filter, and
   the optical filter is disposed in the recess so that the side of the optical filter is in contact with the straight line between the adjacent two of the corners of the recess.

5. The optical receptacle according to claim 1, wherein:
the optical receptacle body includes a recess having a substantially rectangular shape in plan view, the recess having corners subjected to R-chamfering, and
the optical filter has a substantially rectangular shape in plan view, the optical filter having one or more corners subjected to R-chamfering or C-chamfering, wherein:
the optical filter is disposed in the recess so that two adjacent sides of the optical filter are respectively in contact with two adjacent straight lines each between adjacent two of the corners of the recess.

6. The optical receptacle according to claim 1, wherein:
the optical receptacle body further includes a reflection surface configured to reflect the light incident on the first optical surface toward the second optical surface, or the light incident on the second optical surface toward the first optical surface, wherein:
   the $\Delta a$ is a distance from the center of the first optical surface to a second optical axis of a light beam which is incident on the center of the second optical surface so as to travel along the central axis of the second optical surface, the light beam being reflected by the reflection surface; and
   the t is a length of the second optical axis from the center of the second optical surface to a point on the second optical axis, the point being closest to the center of the first optical surface.

7. A optical module comprising:
a substrate;
a plurality of photoelectric conversion elements disposed on the substrate; and
the optical receptacle according to claim 1 disposed on the substrate so that the first optical surfaces face photoelectric conversion elements, respectively.

* * * * *